United States Patent [19]
Yabe et al.

[11] Patent Number: 5,426,390
[45] Date of Patent: Jun. 20, 1995

[54] CIRCUIT FOR GENERATING INPUT TRANSITION DETECTION PULSE

[75] Inventors: Tomoaki Yabe, Toshima; Masataka Matsui; Kouichi Satou, both of Yokohama, all of Japan

[73] Assignee: Kabushiki Kaisha Toshiba, Kanagawa, Japan

[21] Appl. No.: 323,570

[22] Filed: Oct. 17, 1994

Related U.S. Application Data

[63] Continuation of Ser. No. 56,070, Apr. 30, 1993, abandoned.

[30] Foreign Application Priority Data

Jun. 5, 1992 [JP] Japan .................................. 4-145967

[51] Int. Cl.$^6$ ............................................. H03K 3/86
[52] U.S. Cl. .................................. 327/172; 327/270; 327/294
[58] Field of Search ................ 307/241, 242, 243, 265, 307/234, 236, 517, 529, 602, 603, 455, 276, 294; 328/61, 109, 63, 104, 105, 106, 55; 327/31, 36, 38, 172, 269, 270

[56] References Cited

U.S. PATENT DOCUMENTS

| | | | |
|---|---|---|---|
| 3,675,133 | 7/1972 | Frankeny et al. | 307/265 |
| 4,583,008 | 4/1986 | Grugett | 307/265 |
| 4,675,612 | 6/1987 | Adams et al. | 328/55 |
| 4,710,904 | 12/1987 | Suzuki | 307/265 |
| 4,713,621 | 12/1987 | Nakamura et al. | 328/55 |
| 4,805,195 | 2/1989 | Keegan | 328/63 |
| 4,820,944 | 4/1989 | Herlein et al. | 307/603 |
| 5,118,975 | 6/1992 | Hillis et al. | 307/602 |
| 5,210,450 | 5/1993 | Parkinson | 307/601 |

Primary Examiner—Timothy P. Callahan
Assistant Examiner—My Trang Nu Ton
Attorney, Agent, or Firm—Spensley Horn Jubas & Lubitz

[57] ABSTRACT

In input transition detection pulse generators used in semiconductor memory devices, etc., in order to permit a designer to arbitrarily design the power supply voltage dependency of an output pulse width in accordance with use, a scheme is employed such that the functional block for detecting transition of an input or inputs to generate a pulse signal or signals, or the functional block for setting the width of each pulse signal is caused to have a function to generate pulse signals having different power supply voltage dependencies of pulse widths to perform a predetermined logical operation by a logical operation unit on the basis of pulse signals from the input transition detection pulse generation block or the pulse width setting block, thus to output a pulse having a pulse width optimum for a power supply voltage used. In place of the logical operation unit, an approach may be employed to select any one of a plurality of units as the input transition detection pulse generation block or the pulse width setting block by using a control signal to output a pulse having any pulse width. Further, the input transition pulse generation block or the pulse width setting block may be constructed to set at least one pulse width of pulses generated therefrom on the basis of a delay time generated by using an RC delay line.

22 Claims, 6 Drawing Sheets

CIRCUIT FOR GENERATING INPUT TRANSITION DETECTION PULSE

This is a continuation of application Ser. No. 08/056,070, filed Apr. 30, 1993, now abandoned.

BACKGROUND OF THE INVENTION

This invention relates to a circuit for generating an input transition detection pulse.

Circuits adapted for detecting change of an input signal and producing an output signal of a predetermined pulse width are widely used in such applications as semiconductor memory devices. Even in cases where input transition detection pulse generator circuits (hereinafter referred to as input transition detection pulse generators depending upon circumstances), are driven by different power supply voltages according to use, they are required to meet these conditions. Namely, in the case where the power supply voltage Vcc is, e.g., more than 1.5 volts, the input transition detection pulse generator outputs, with a view to performing high speed operation, a signal such that its pulse width is not broader than a fixed value. In contrast, in the case where the power supply voltage Vcc is, e.g., lower than 1.5 volts, the input transition detection pulse generator outputs, by employing a scheme such that prevention of an erroneous operation is considered to be more preferential than high speed operation, a signal of a broader pulse width to the extent the power supply voltage Vcc decreases. To meet such requirements in operation, a designer needs to arbitrarily change the power supply voltage dependency of the pulse width.

The configuration of a conventional input transition detection pulse generator is shown in a block form in FIG. 9. To an input transition detection pulse generation unit/pulse width setting unit 141, (N+1) signals A0, A1, ---, AN are input. When transition (change in level) is detected in at least one of these signals, a pulse signal having a predetermined pulse width is output.

As stated above, the input transition detection pulse generation unit for detecting transition of an input to generate a pulse signal and the pulse width setting unit for setting the width of this pulse signal were conventionally constituted with a single circuit 141 without taking into consideration the power supply voltage dependency of the output pulse width. For this reason, it was extremely difficult for a designer to arbitrarily set the power supply voltage dependency of the output pulse width in accordance with the use.

SUMMARY OF THE INVENTION

Accordingly, an object of this invention is to provide an input transition detection pulse generator in which the degree of design freedom is large with respect to the power supply voltage dependency of the output pulse width.

In accordance with this invention, there is provided an input transition detection pulse generation circuit comprising: a plurality of input transition detection pulse generation units adapted so that a single or plural signals are input thereto to detect transition of each signal to generate first pulses, power supply voltage dependencies of pulse widths of the first pulses respectively generated being caused to be different from each other; and a logical operation unit adapted so that the first pulses respectively generated from the input transition detection pulse generation units are input thereto to output a second pulse obtained by performing logical operation.

In operation, when a single or plural signals are input to the plural input transition detection pulse generation units and any transition is detected thereat, first pulses are generated. As stated above, pulse widths of these first pulses have power supply voltage dependencies caused to be different from each other by respective input transition detection pulse generation units. Accordingly, it is possible to make a design such that when first pulses generated from the respective input transition detection pulse generation units are inputted to the logical operation unit, and they are outputted as a second pulse as the result of logical operation; the width of this second pulse has a desired power supply voltage dependency.

In this invention, a circuit configuration may be employed in place of the logical operation unit to select any one of a plurality of input transition detection pulse generation units by using a control signal, whereby a first pulse having any pulse width is output to external circuits. Also in this case, a pulse of a pulse width having a desired power supply voltage dependency may be output to external circuits.

Further, the input transition detection pulse generation unit may be constructed to set at least one pulse width of the first pulses on the basis of a delay time generated by using an RC delay line. In this case, it is possible to output a pulse having a low power supply voltage dependency.

Alternatively, an input transition detection pulse generator according to this invention may comprise: an input transition detection pulse generation unit adapted so that a single or plural signals are input thereto to detect transition of each signal to generate a first pulse; a plurality of pulse width setting units adapted so that the first pulse generated from the input transition detection pulse generation unit is input to each of the plurality of pulse width setting units to respectively generate second pulses, pulse widths of the respective second pulses generated being caused to be different from each other; and a logical operation unit adapted so that the second pulses respectively generated from the pulse width setting units are input thereto to output a third pulse obtained by performing logical operation. In this case, transition of a signal input to the input transition detection pulse generation unit is first detected. As a result, a first pulse is generated, and is then input to each of a plurality of pulse width setting units. When the first pulse is input to the pulse width setting units, second pulses are generated. The power supply voltage dependencies of pulse widths of the second pulses are caused to be different from each other by the pulse width setting units. These second pulses are then input to the logical operation unit, at which logical operation is performed. As a result, they are output as a third pulse, whereby it is possible to output a third pulse of a pulse width having a desired power supply voltage dependency.

In the above-mentioned implementation, a circuit configuration may be employed in place of the logical operation unit to select any one of a plurality of pulse width setting units by a control signal so that a second pulse having any pulse width is output to external circuits. Also in this case, a pulse of a pulse width having a desired power supply voltage dependency may be output to external circuits.

In addition, the pulse width setting unit may be constructed to set at least one pulse width of the second pulses on the basis of a delay time generated by using a RC delay line. In this case, it is possible to output a pulse having low power supply voltage dependency.

DESCRIPTION OF THE PREFERRED EMBODIMENTS

Figure 1:
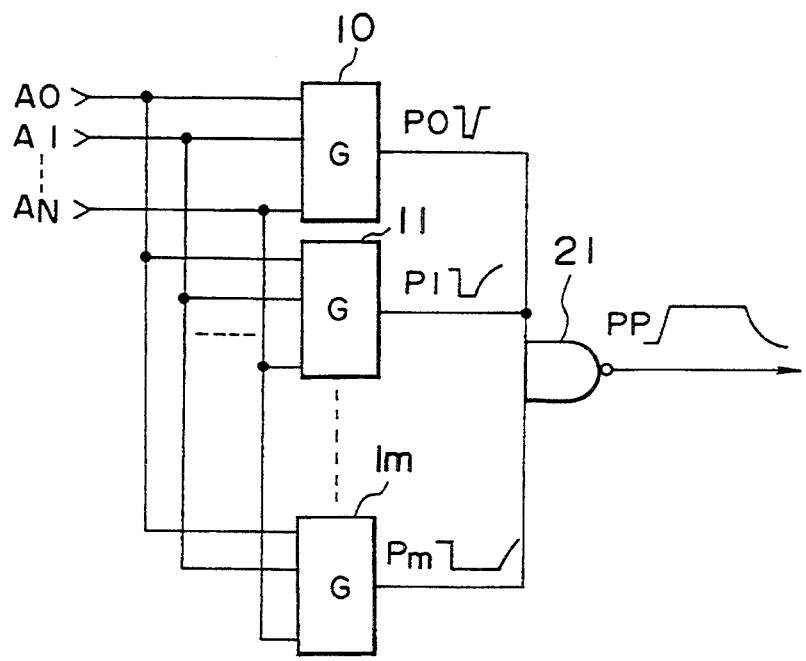
FIG. 1 is a block diagram showing the configuration of an input transition detection pulse generator according to a first embodiment of this invention.

Preferred embodiments of this invention will now be described with reference to the attached drawings. The configuration of an input transition detection pulse generation circuit according to a first embodiment of this invention is shown in FIG. 1. This circuit comprises (m+1) input transition detection pulse generation units 10-1m, and a NAND gate 21. To the input transition detection pulse generation units 10-1m, input terminals adapted so that (N+1) input signals A0-AN are inputted thereto are connected, respectively. Respective output terminals of the input transition detection pulse generation units are connected to input terminals of the NAND gate 21. The output terminal of the NAND gate 21 is connected to the output terminal of this circuit.

These input transition detection pulse generation units 10-1m have both the function as input transition detection units for respectively detecting transitions of input signals A0-AN and the function as pulse width setting units for setting pulse widths of downward, i.e., negative going pulse signals P0-Pm which are output therefrom.

In the input transition detection pulse generation units 10-1m, power supply voltage dependencies of pulse widths of output pulses P0-Pm are caused to be different from each other. As shown in FIG. 1, pulse widths during which downward, i.e., negative going output pulses P0-Pm generated from the input transition detection pulse generation units 10, 11, - - - , 1m are maintained at low level become broader in order of the input transition detection pulse generation units 10, 11, - - - , 1m. For this reason, in the case where timings at which respective output pulses P0-Pm fall are concurrent, the width of a pulse PP output from the NAND circuit 21 is determined by a pulse of the broadest width of output pulses P0-Pm. Accordingly, by varying the power supply voltage dependencies of output pulses P0-Pm widths in the input transition detection pulse generation unit/pulse width setting units 10-1m, it becomes possible to freely set the pulse width of a pulse PP finally outputted from the NAND gate 21.

Figure 2:
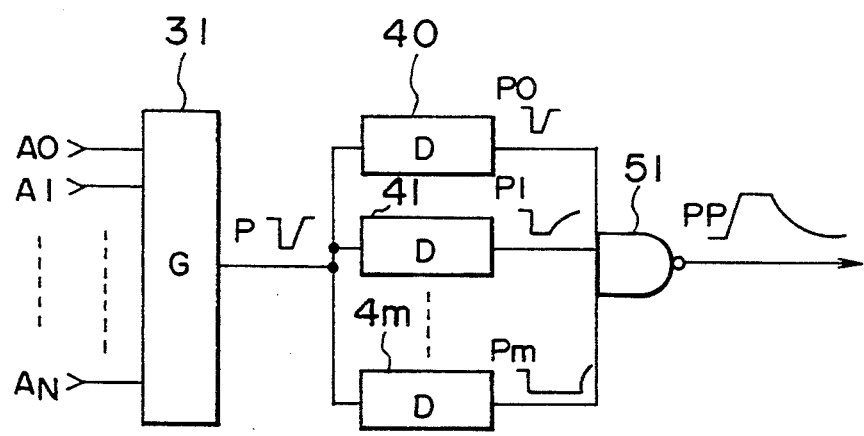
FIG. 2 is a block diagram showing the configuration of an input transition detection pulse generator according to a second embodiment of this invention.

An input transition detection pulse generation circuit according to a second embodiment of this invention is shown in FIG. 2. In the first embodiment, the input transition detection pulse generation unit and the pulse width setting unit are integrally formed with a single circuit. There are provided (m+1) circuits of such a structure. On the contrary, in the second embodiment, a single input transition detection pulse generation unit 31 and (M+1) pulse width setting units 40-4m are separately provided. In these pulse width setting units 40-4m, setting is made such that dependencies of pulse widths with respect to the power supply voltage are caused to be different from each other.

When (N+1) input signals A0-AN are input to the input transition detection pulse generation unit 31 and transition of at least one signal is detected, a downward, i.e., negative going pulse P is output. This pulse P is input to m+1 pulse width setting units 40-4m. As a result, pulses having pulse widths different from each other are output to a NAND gate 51. Also in this embodiment, the width of a pulse PP finally output from the NAND gate 51 is determined by a pulse having the broadest width of pulses outputted from the pulse width setting units 40-4m.

Figure 5:
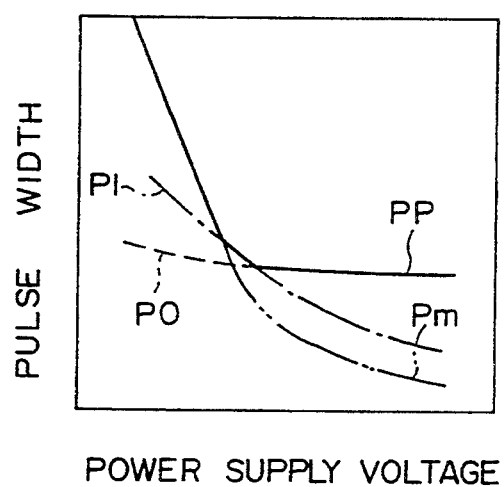
FIG. 5 is an explanatory view showing power supply voltage dependency of the pulse width in the input transition detection pulse generators according to the first and second embodiments.

Here, the power supply voltage dependencies of (M+1) pulses P0-Pm respectively output from the input transition detection pulse generation units 10-1m in the first embodiment, or the pulse width setting units 40-4m in the second embodiment, and a pulse PP output from the NAND circuit 21 or 51 are shown as a concept in FIG. 5. For example, the pulse P0 has the lowest dependency with respect to the power supply voltage, and its pulse width is not so affected even if a power supply voltage varies. The dependency with respect to the power supply voltage becomes higher in order of pulses P1, P2, - - -. The pulse Pm has the highest power supply voltage dependency.

When such pulses P0-Pm are input to the NAND gate 21 or 51, a pulse PP in a form synthesized so that the pulse width is the broadest is output. In view of this, by setting dependency of the input transition detection pulse generation units 10-1m of the first embodiment, or the pulse width setting units 40-4m of the second embodiment so that the pulse width of the pulse finally obtained has an optimum power supply voltage dependency, a pulse PP having a desired pulse width is obtained.

As described above, the input transition detection pulse generation circuits of the first and second embodiments are both provided with a plurality of input transition pulse generation units 10-1m or pulse width setting units 40-4m adapted for generating pulses having power supply voltage dependencies of the pulse widths different from each other, and serve to perform logical operation by the NAND gate to generate a final pulse PP.

On the contrary, in third and fourth embodiments, a circuit configuration is employed in place of the NAND gate such that a pulse from a circuit selected and activated by a control signal is output to thereby arbitrarily set the width of an output pulse. The third embodiment of this invention will be first described with reference to FIG. 3.

Figure 3:
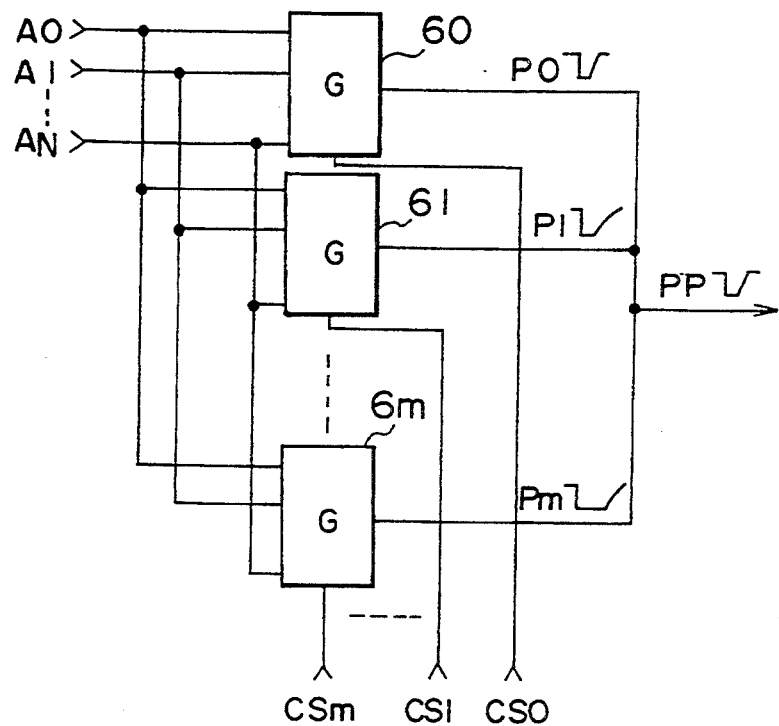
FIG. 3 is a block diagram showing the configuration of an input transition detection pulse generator according to a third embodiment of this invention.

In FIG. 3, there are provided (M+1) input transition detection pulse generation units 60-6m doubling as a function of a pulse width setting unit. Setting is made such that power supply voltage dependencies of pulse widths of output pulses PO-Pm of respective input transition detection pulse generation units 60-6m are caused to be different from each other.

To the respective input transition detection pulse generation units 60-6m, (N+1) input signals AO-AN are input. Further, to the input transition detection pulse generation units 60-6m, (M+1) control signals CSO, CS1, - - - , CSm different from each other are input. Which of the control signals CSO, CS1, - - - , CSm is caused to become active varies in dependency upon the power supply voltage. Namely, the control signal CS is varied so that one unit to output a pulse of a pulse width most suitable for a power supply voltage at that time of (M+1) input transition detection pulse generation units 60-6m is selected and activated.

As stated above, by selecting any one of the input transition detection pulse generation units 60-6m by an arbitrary control signal CS so that a pulse PP of a pulse width most suitable for a power supply voltage used is outputted, it becomes possible to freely design the power supply voltage dependency of the pulse width.

Figure 4:
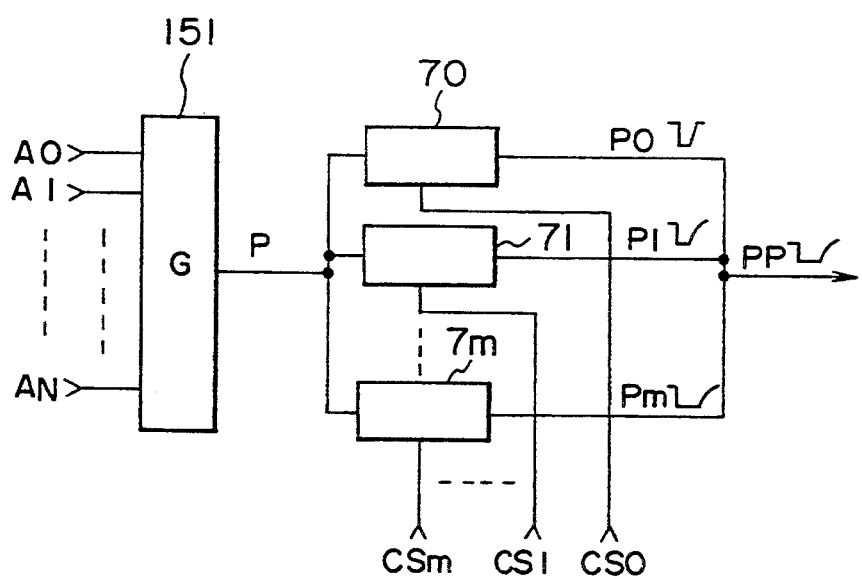
FIG. 4 is a block diagram showing the configuration of an input transition detection pulse generator according to a fourth embodiment of this invention.

An input transition detection pulse generation circuit according to the fourth embodiment of this invention shown in FIG. 4 differs from that of the third embodiment in that an input transition detection pulse generation unit 151 and pulse width setting units 70-7m are separately provided, but is the same as that of the third embodiment in that the pulse width of the output pulse PP is selected by control signals CSO, CS1, - - - , CSm.

In operation, (N+1) input signals AO-AN are input to the input transition detection pulse generation unit 151, at which transition of at least one signal is detected. As a result, a pulse P is output therefrom. This pulse P is input to (M+1) pulse width setting units 70-7m. In these pulse width setting units 70-7m, dependencies with respect to the power supply voltage of the pulse widths of pulses PO-Pm outputted therefrom are caused to be different from each other. To the pulse width setting units 70-7m, control signals CSO-CSm are inputted, respectively. One of the pulse width setting units 70-7m is selected and activated by an arbitrary control signal CS so that a pulse having a pulse width corresponding to a power supply voltage used of the pulses PO-Pm is output. As a result, the pulse thus obtained is output as a final pulse PP.

An input transition detection pulse generation circuit according to a fifth embodiment of this invention will now be described. In this embodiment, a wired-OR type circuit is used for the pulse width setting unit.

Figure 6:
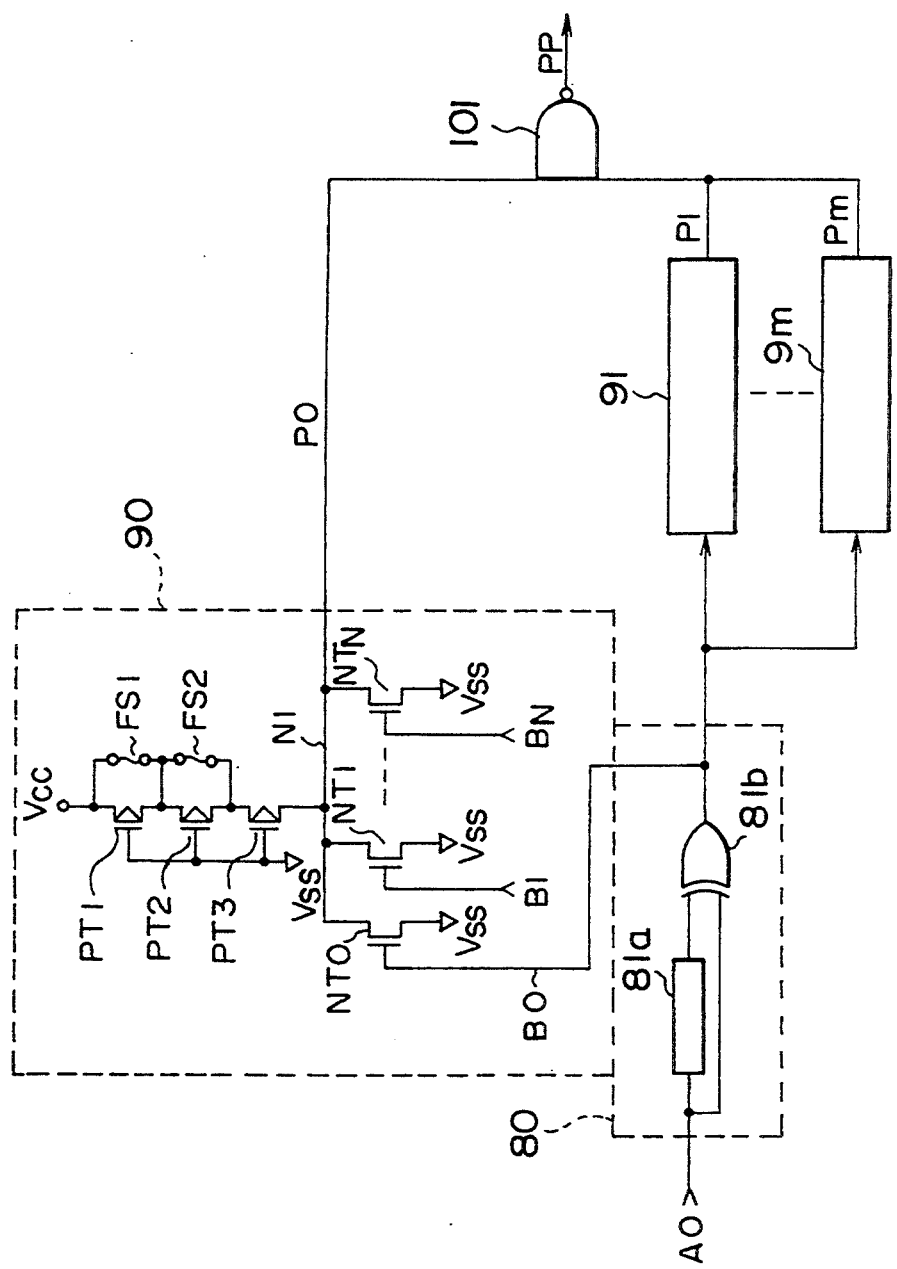
FIG. 6 is a block diagram showing the configuration of an input transition detection pulse generator according to a fifth embodiment of this invention.

The circuit configuration of this embodiment is shown in FIG. 6. In this figure, a portion of a circuit provided for detecting transition of one input signal AO of (N+1) input signals AO-AN to output a pulse is shown. The portion of the circuit shown here includes an input transition detection pulse generation unit 80, pulse width setting units 90-9m, and a NAND gate 101.

More particularly, the input transition detection pulse generation unit 80 is such that when one input signal AO of input signals AO-AN is input thereto, it detects transition thereof to output a pulse BO. The circuit of this embodiment further includes N input transition detection pulse generation units 81-8N (not shown). When input signals A1-AN (not shown) are respectively input to these input transition detection pulse generation units, they detect transitions thereof to output pulses B1-BN.

Each of input transition detection pulse generation units 80-8N comprises a delay circuit 81a and an EX-OR gate 81b. When the input transition detection pulse generation unit 80 is taken as an example, an input signal AO is directly input to one of two input terminals of the EX-OR gate 81b, and input signal AO delayed by a predetermined time through the delay circuit 81a is input to the other terminal thereof. Thus, when an input signal AO changes, i.e., there is any transition in that signal, that transition is detected at the input transition detection pulse generation unit 80. As a result, a pulse BO is output.

To the pulse width setting units 90-9m, all of the pulses BO-BN output from (N+1) input transition detection pulse generation units 80-8N are respectively input. Respective pulse width setting units 90-9m are constructed as described below. Namely, when the pulse width setting unit 90 shown is taken as an example, drains of an N number of N-channel transistors NT1-NTN are connected in parallel with a node N1. Respective sources of these N-channel transistors NT1-NTN are grounded, and N pulses BO-BN are input to their gates, respectively. Moreover, between a power supply voltage Vcc terminal and the node N1, three P-channel transistors PT1-PT3 are connected in series. Respective gates of the P-channel transistors PT1-PT3 are all grounded. Between the source and the drain of the P-channel transistor PT1, a fuse FS1 is connected in parallel. In addition, between the source and the drain of the P-channel transistor PT2, a fuse FS2 is connected in parallel.

In this example, the P-channel transistors PT1-PTN have a drive capability smaller than that of the N-channel transistors NT1-NTN. Ordinarily, the node N1 is in a charged state by P-channel transistors PT1-PTN. When at least one of pulses BO-BN is caused to be at high level, an N-channel transistor NT where that pulse B is input to its gate is turned ON. As a result, a potential on the node N1 drops. When all pulses BO-BN are returned to low level, N-channel transistors NT1-NTN are turned OFF. As a result, the potential on the node N1 is returned to high level.

In this case, the speed required for charging the node N1 is caused to be low by opening the fuses FS1 and FS2, so widths of pulses output from the pulse width setting units 90-9m are widened. By controlling or adjusting whether or not fuses FS1 and FS2 should be opened by all respective pulse width setting Units 90-9m, it is possible to vary the power supply voltage dependency of the pulse width.

The NAND gate 101 operates in such a manner that when pulses PO-Pm output from the pulse width setting units 90-9m are input thereto, it performs logical operation to output a final pulse PP.

In this way, pulses PO-PN having different pulse widths are respectively output from the pulse width setting units 90-9m, and are input to the NAND gate 101. From the NAND gate 101, a final pulse PP is output in a form synthesized so that the pulse width is the broadest.

Figure 7:
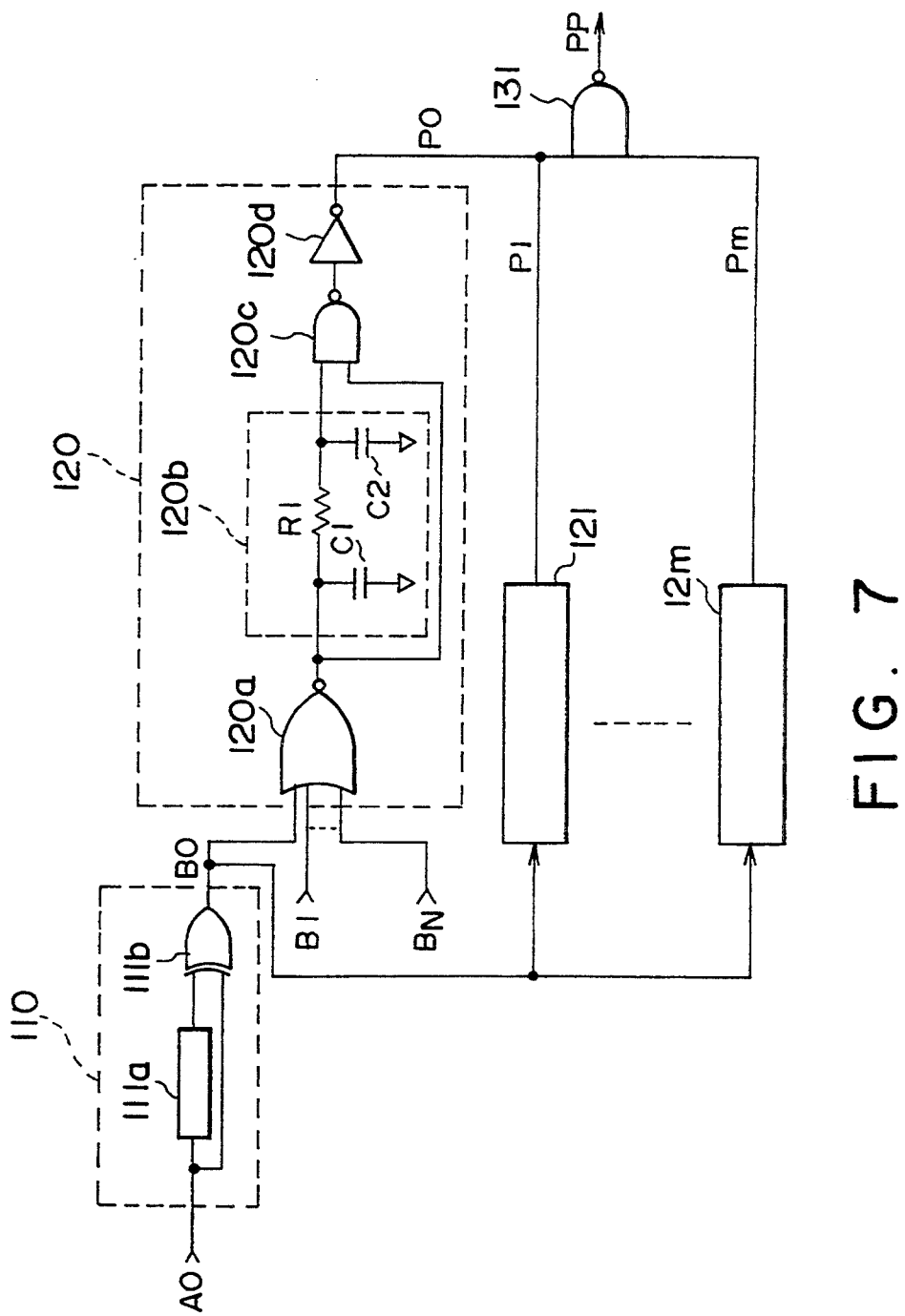
FIG. 7 is a block diagram showing the configuration of an input transition detection pulse generator according to a sixth embodiment of this invention.

An input transition detection pulse generation circuit according to a sixth embodiment of this invention will now be described. This embodiment is characterized in that an RC delay line is used for the pulse width setting unit. A portion of the configuration of a circuit for detecting transition of one signal AO of input signals AO-AN to generate a pulse in the same manner as in the case of the fifth embodiment is shown in FIG. 7.

The circuit of this embodiment includes an input transition detection pulse generation unit 110, input transition detection pulse generation units 111-11N (not shown), (M+1) pulse width setting units 120-12m, and a NAND gate 131.

The input transition detection pulse generation units 110-11N include, similarly to the input transition detection pulse generation units 80-8N in the fifth embodiment, a delay circuit 111a and an EX-OR circuit 111b. In the case where the input transition detection pulse generation unit 110 is taken as an example, when an input signal AO is input thereto, and the level thereof is changed, i.e., any transition takes place, a pulse BO is output.

The pulse width setting units 120-12m include, similarly to the pulse width setting unit 120 shown, a NOR gate 120a; an RC delay line 120b having capacitors C1 and C2, and a resistor R1; a NAND gate 120c; and an inverter 120d. To the respective NOR gates 120a, signals BO-BN output from the input transition detection pulse generation units 110-11N are input. As a result, a signal to maintain low level for a time period during which at least one signal is at high level is output, and is then input to the RC delay line 120b. This signal is directly input to one input terminal of the NAND gate 120d. On the other hand, this signal is delayed by the RC delay line 120b, and is then input to the other input terminal of the NAND gate 120c. From the NAND gate 120c, a pulse of which pulse width corresponds to a delay time of the RC delay line 120b is output. The signal thus obtained is inverted by the inverter 120d, and is then outputted as a pulse PO.

In the (M+1) pulse width setting units 120-12m, setting is made such that delay times of the respective RC delay lines 120b are different from each other. Thus, pulse widths of pulses PO-Pm output from the pulse width setting units 120-12m have power supply voltage dependencies different from each other. In this embodiment, (M+1) pulses PO-Pm output from the pulse width setting units 120-12m are input to the NAND gate 131. As a result, a pulse PP where the pulse width is the broadest is generated, and is then output to external circuits.

Figure 8:
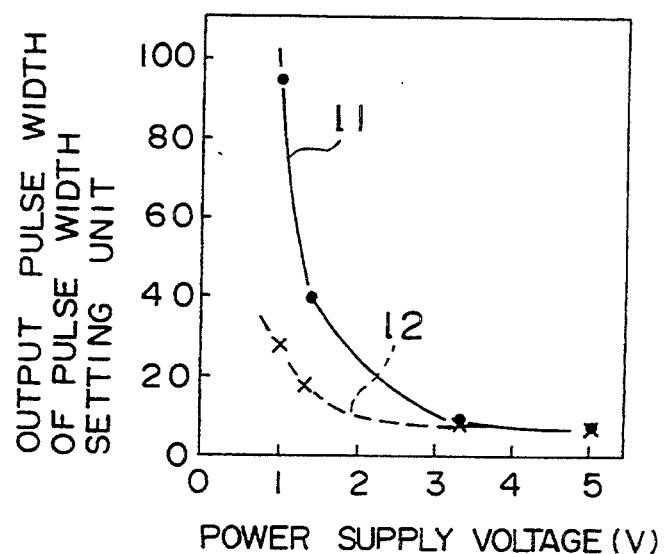
FIG. 8 is an explanatory view showing dependency with respect to the power supply voltage of the pulse width in the input transition detection pulse generators according to the fifth and sixth embodiments.
Figure 9:
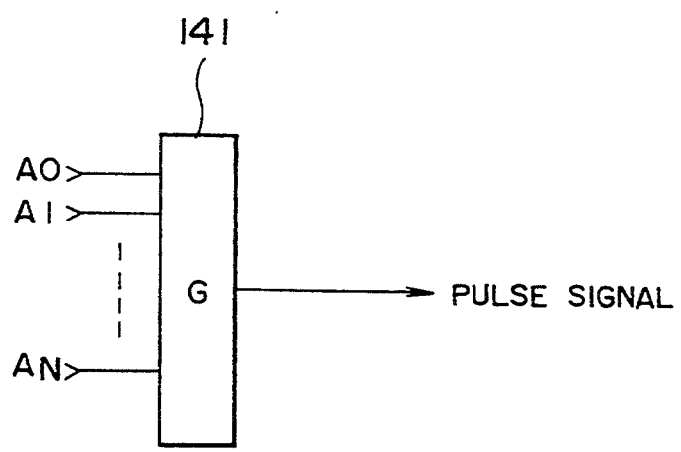
FIG. 9 is a block diagram showing the configuration of a conventional input transition detection pulse generator.

In the sixth embodiment, an RC delay line is used for setting of the pulse width. For this reason, as compared to the fifth embodiment using a wired-OR circuit, it is possible to output a pulse having a lower power supply voltage dependency of the pulse width. The power supply voltage dependencies of the pulse widths of the output pulse of the fifth and sixth embodiments are shown in FIG. 8. It is seen that the width of the output pulse PP by the sixth embodiment indicated by the line −2 has a power supply voltage dependency lower than that of the width of the output pulse PP by the fifth embodiment indicated by the line −1. Especially, in the range of a power supply voltage lower than 3 volts, such a tendency is conspicuous. Thus, in the case where a characteristic such that the pulse width is not so broad on the lower power supply voltage side is required, the circuit by the sixth embodiment using an RC delay line is more effective.

It should be noted that all the above-described embodiments are presented only for an illustrative purpose, and therefore do not limit this invention in any sense. For example, in all of the above-described embodiments, a plurality of input signal AO-AN are inputted, and when at least one of these signals varies, i.e., there is any transition in at least one signal, detection of this change (transition) is carried out. However, there may be employed a circuit configuration to detect that specific input signals have changed, or a circuit configuration to detect that all input signals have changed. Further, there may be employed a circuit configuration adapted so that one signal is inputted thereto to detect transition thereof to output a pulse. In addition, while, a NAND gate is provided as the logical operation unit in the first and second embodiments, other logical operation means may be used for this purpose.

What is claimed is:

1. An input transition detection pulse generation circuit comprising:
   a plurality of input transition detection pulse generation units;
   at least one input signal line coupled to each of the plurality of input transition detection pulse units, wherein the at least one input signal line provides an input signal to the plurality of input transition detection pulse generation units, and wherein the plurality of input transition detection pulse generation units generate at least one first pulse in response to at least one signal transition on said at least one input signal line;
   a plurality of pulse width setting units each coupled to receive an output signal from each of the plurality of input transition detection pulse generation units, said plurality of pulse width setting units coupled to a power supply voltage that defines a logic voltage level for a circuit coupled to receive an output from the input transition detection pulse generation circuit, the plurality of pulse width setting units each generating a second pulse in response to detection of the at least one first pulse, each second pulse characterized by a pulse width which varies in accordance with the power supply voltage; and
   a logical operation unit coupled to the plurality of pulse width setting units so as to receive the second pulse output by each of the pulse width setting units, wherein the logical operation unit generates a third pulse by performing a logical operation on the second pulses.

2. The circuit of claim 1 wherein the pulse width setting units include a first pulse width setting unit and a second pulse width setting unit, wherein the third pulse is characterized by a pulse width determined by said first pulse width setting unit for a first value of the power supply voltage and wherein the third pulse has a pulse width determined by said second pulse width setting unit for a second value of the power supply voltage.

3. The circuit of claim 1 wherein at least one of the pulse width setting units comprises a circuit having an RC delay time so that the pulse width of the second pulse generated by the at least one of the input transition detection pulse generation units is determined by the RC delay time of the at least one of the pulse width setting units.

4. An input transition detection pulse generation circuit comprising:

an input transition detection pulse generation unit which receives at least one input signal, the input transition detection pulse generation unit generating a first pulse in response to a transition in the at least one input signal, wherein the first pulse has an amplitude determined by a power supply voltage and wherein the power supply voltage defines a logic voltage level for a circuit coupled to an output of the input transition detection pulse generation circuit;

a plurality of pulse width setting units, each of the pulse width setting units coupled to the input transition detection pulse generation unit to receive the first pulse from the input transition detection pulse generation unit, wherein each of the pulse width setting units generates a second pulse having a pulse width determined by the power supply voltage, and wherein each of the pulse widths of the second pulses is different; and a logical operation unit coupled to the plurality of pulse width setting units to receive the second pulses from the plurality of pulse width setting units, the logical operation unit generating a third pulse by performing a logical operation on the second pulses.

5. The circuit of claim 4 wherein the pulse width of said third pulse varies inversely with the power supply voltage.

6. The circuit of claim 4 wherein at least one of the plurality of pulse width setting units comprises a circuit having an RC delay time so that the pulse width of the second pulse generated by the at least one of the plurality of pulse width setting units is determined by the RC delay time of the at least one of the plurality of pulse width setting units.

7. An input transition detection pulse generation circuit comprising:

an input transition detection pulse generation unit which receives an input signal, the input transition detection pulse generation unit delaying the input signal, comparing the input signal with the delayed input signal, and generating a first pulse in response to a transition of the input signal when the input signal becomes different from the delayed input signal;

a plurality of pulse width setting units coupled to receive the first pulse from the input transition detection pulse generation unit, each of the pulse width setting units having a resistive means coupled between a first power supply voltage terminal and an output terminal and a switching element coupled between the output terminal and a second power supply voltage terminal which changes an on-off state in response to the first pulse outputted from the input transition detection pulse generation unit, wherein the respective resistance values of the resistive elements in the pulse width setting units are different from each other so that second pulses having pulse widths being different from each other are outputted from the output terminals of the respective pulse width setting units; and a logical operation unit coupled to receive the second pulses from the pulse width setting units, the logical operation unit generating a third pulse by performing a logical operation on the second pulses.

8. The input transition detection pulse generation circuit as set forth in claim 7, wherein each of the resistive means of the pulse width setting units has a plurality of resistive elements coupled in series between the first power supply voltage terminal and the output terminal and at least one fuse element coupled in parallel to one of the resistive elements, wherein a resistance value between the first power supply voltage terminal and the output terminal varies in accordance with whether or not the fuse element is blown so that the pulse widths of the respective second pulses change in accordance with the resistance value.

9. The input transition detection pulse generation circuit as set forth in claim 7, wherein the input transition detection pulse generation unit comprises a circuit having an RC delay time for delaying the input signal, and an EX-OR gate for comparing the input signal with the delayed input signal and outputting the first pulse.

10. The input transition detection pulse generation circuit as set forth in claim 7, wherein the pulse width of the third pulse varies inversely with the power supply voltage.

11. An input transition detection pulse generation circuit comprising:

an input transition detection pulse generation unit which has N input transition detection pulse generation means, where N is an integer greater than or equal to 2, and receives N input signals, wherein each of the input transition detection pulse generation means receives one of the input signals and delays the input signal, compares the input signal with the delayed input signal, and generates a first pulse in response to a transition of the input signal at which the input signal becomes different from the delayed input signal;

a pulse width setting unit having M pulse width setting means, where M is an integer greater than or equal to 2, and receives the first pulses from the input transition detection pulse generation unit, wherein each of the pulse width setting means is coupled to receive N first pulses, has a resistive means coupled between a first power supply voltage terminal and an output terminal, and N switching elements coupled between the output terminal and a second power supply voltage terminal which changes the respective on-off states in response to the first pulses respectively, the resistance values of the resistive elements in the respective pulse width setting means are different from each other so that M second pulses having pulse widths different from each other are outputted from the output terminals of the respective pulse width setting means; and a logical operation unit coupled to receive the second pulses from the pulse width setting unit, the logical operation unit generating a third pulse by performing a logical operation on the second pulses.

12. The input transition detection pulse generation circuit as set forth in claim 11 wherein each of the resistive means of the pulse width setting unit has a plurality of resistive elements coupled in series between the first power supply voltage terminal and the output terminal and at least one fuse element coupled in parallel to one of the resistive elements, wherein a resistance value between the first power supply voltage terminal and the output terminal varies in accordance with whether or not the fuse element is blown so that the pulse widths of the respective second pulses change in accordance with the resistance value.

13. The input transition detection pulse generation circuit as set forth in claim 11, wherein each of the input transition detection pulse generation means comprises a circuit having an RC delay time for delaying the input signal, and an EX-OR gate for comparing the input signal with the delayed input signal and outputting the first pulse.

14. The input transition detection pulse generation circuit as set forth in claim 11, wherein the pulse width of the third pulse varies inversely with the power supply voltage.

15. An input transition detection pulse generation circuit comprising:

an input transition detection pulse generation unit which receives an input signal, the input transition detection pulse generation unit delaying the input signal, and generating a first pulse in response to a transition of the input signal at which the input signal becomes different from the delayed input signal;

a plurality of pulse width setting units coupled to receive the first pulse from the input transition detection pulse generation unit, each of the pulse width setting units having a delay line which delays the first pulse and a logical gate which receives the first pulse and the delayed first pulse and outputs a second pulse having a pulse width corresponding to the delay time of the delay line, wherein the delay time of the delay line in the respective pulse width setting units are different from each other so that the second pulses having pulse widths being different from each other are outputted from the respective pulse width setting units, the logical operation unit generating a third pulse by performing a logical operation on the second pulses.

16. The input transition detection pulse generation circuit as set forth in claim 15, wherein each of the delay lines of the pulse width setting units has a resistor and a capacitor which determine the delay time.

17. The input transition detection pulse generation circuit as set forth in claim 15, wherein the input transition detection pulse generation unit comprises a circuit having an RC delay time for delaying the input signal and an EX-OR gate for comparing the input signal with the delayed input signal and outputting the first pulse.

18. The input transition detection pulse generation circuit as set forth in claim 15, wherein the pulse width of the third pulse varies inversely with the power supply voltage.

19. An input transition detection pulse generation circuit comprising:

an input transition detection pulse generation unit which has N input transition detection pulse generation means, where N is an integer greater than or equal to 2, and receives N input signals, wherein each of the input transition detection pulse generation means receives one of the input signals and delays the input signal, compares the input signal with the delayed input signal, and generates a first pulse in response to a transition of the input signal at which the input signal becomes different from the delayed input signal;

a pulse width setting unit having M pulse width setting means, where M is an integer greater than or equal to 2, and receives the first pulses from the input transition detection pulse generation unit, wherein each of the pulse width setting means has a first logical gate which receives the N first pulses and generates a second pulse by performing a logical operation on the first pulses, a delay line which delays the second pulse, and a second logical gate which receives the second pulse and the delayed second pulse and outputs a third pulse having a pulse width corresponding to the delay time of the delay line, wherein the delay time of the delay line in the respective pulse width setting means are different from each other so that the third pulses having pulse widths being different from each other are outputted from the respective pulse width setting means; and a logical operation unit coupled to receive the third pulses from the pulse width setting unit, the logical operation unit generating a fourth pulse by performing a logical operation on the third pulses.

20. The input transition detection pulse generation circuit as set forth in claim 19, wherein each of the pulse width setting means has a resistor and a capacitor which determine the delay time.

21. The input transition detection pulse generation circuit as set forth in claim 19, wherein each of the input transition detection pulse generation means comprises a circuit having an RC delay time for delaying the input signal and an EX-OR gate for comparing the input signal with the delayed input signal and outputting the first pulse.

22. The input transition detection pulse generation circuit as set forth in claim 19, wherein the pulse width of the fourth pulse varies inversely with the power supply voltage.

* * * * *